METHOD OF FABRICATING SMALL-AREA SEMICONDUCTOR DEVICES

Filed June 6, 1969

INVENTOR

Arthur Uhlir, Jr.

United States Patent Office 3,575,732

Patented Apr. 20, 1971

3,575,732
METHOD OF FABRICATING SMALL-AREA SEMICONDUCTOR DEVICES

Arthur Uhlir, Jr., Weston, Mass., assignor to Microwave Associates, Inc., Burlington, Mass.

Continuation-in-part of abandoned application Ser. No. 626,882, Mar. 29, 1967. This application June 6, 1969, Ser. No. 834,209

Int. Cl. H01l 7/54

U.S. Cl. 148—15 13 Claims

ABSTRACT OF THE DISCLOSURE

This invention relates to a method of manufacturing extremely small area semiconductor devices by first producing very small apertures by means of energetic particles in non-conductive passivating layers placed on semiconductors, and the subsequent use of these apertures to fabricate semiconductor devices of exceptionally good high-frequency performance.

Figure 1:
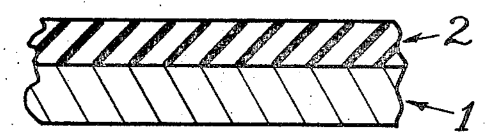

The technique is based upon the damage tracks produced in insulating solids used to passivate semiconductors by exposing them to energetic particles such as, for example, alpha particles above a threshold value, and subsequently etching away the damaged region to leave very small apertures in the insulating solid. Semiconductor plating and fabricating techniques are subsequently used to produce a variety of semiconductors and in particular semiconductors of the Schottky diode type.

RELATED APPLICATIONS

This application is a continuation-in-part of application Ser. No. 626,882 filed Mar. 29, 1967, now abandoned, by Arthur Uhlir, Jr., the inventor in the present application, and assigned to the same assignee as the present invention.

BACKGROUND OF THE INVENTION

This invention relates to a method of fabricating small-area semiconductor devices, and more particularly to those devices which are used for rectifying and controlling microwave signals, as in microwave mixer or detector diodes.

Microwave mixers and/or detectors convert microwave signals to lower frequencies where they can be detected, amplified or otherwise more easily handled. Microwave mixer and/or detector diodes should therefore be good rectifiers at high frequencies. Their static D.C. characteristic should, therefore, for an ideal rectifier, exhibit an infinite conductance at small forward voltage. Another requirement is that rectification be a majority carrier phenomenon, i.e., a non-injecting rectifying junction, so that frequency is not carrier lifetime dependent. Still another requirement is that series resistance ($R_S$) and capacitance (C), whose product gives the time constant, must be kept at a minimum to reduce signal loss and noise contribution from thermal noise. This latter requirement and the previous one implies that frequency response of the diode is limited only by the time constant or RC charging time rather than the majority carrier lifetime up to the dielectric relaxation frequency of the semiconductor. To be an effective rectifier at the signal frequency, the time varying conductance of the diode must be relatively large compared to the susceptance of the diode at the signal frequency. This requirement puts a severe limitation on the total capacitance that may be used in high-frequency mixer diodes. In order to allow for their use in high-frequency bands, it is also necessary to reduce the so-called barrier-capacitance to a minimum, because it represents a bypass for high-frequency signals and so causes a low detection or conversion efficiency. To fulfill these requirements the junction area of the diode should be as small as possible, particularly as the desired application approaches the upper limit of the frequency spectrum.

Prior art devices having small area diodes have been fabricated by the method of R. F. Rutz, "Method of Forming an Extremely Small Junction," U.S. Patent No. 3,171,762, wherein on one surface of a semiconductor wafer, conical or pyramidal pits are formed and subsequent processing forms small junctions by deposition of semiconductive material in the pits, lapping or etching the reverse side of the wafer to expose the small tip of the pyramid, and final deposition of semiconductive material over the exposed small junction.

Another method for forming small area semiconductor junctions well known in the art is the planar junction technique, wherein a semiconductor body is provided with a permanent protective coating such as silicon dioxide on one of its surfaces; a light sensitive photoresist is applied over the protective coating, and then exposed to ultra violet light through a mask having small apertures; then the photo resist is developed resulting in small windows or apertures therein; and subsequent etching through these windows produces small holes or apertures in the protective coating. Conventional deposition alloying or diffusing techniques through these small holes result in small-area semiconductor junctions. Variations of the technique are described in U.S. Patent No. 3,064,167 of J. A. Hoerni, "A Semiconductor Device," and also in U.S. Patent No. 3,397,449 of D. A. Jenny, "Making P–N Junction Under Glass."

However, it is difficult by photographic techniques to attain the resolution required in semiconductor rectifiers for frequencies of 100 gHz. or higher. The wavelength of the light used in the photographic technique sets a limit on the accuracy with which the apertures can be formed. The resolving power of the photographic materials also sets a limit on the attainable resolution and holes smaller than 0.00006 inch are difficult to obtain.

The invention described herein is a method of overcoming these problems by producing apertures in the protective or passivating non-conductive layer of the semiconductor by means of energetic particles, such as alpha particles, and the subsequent use of these apertures to fabricate semiconductor devices of improved high-frequency performance.

SUMMARY OF THE INVENTION

Figure 5:
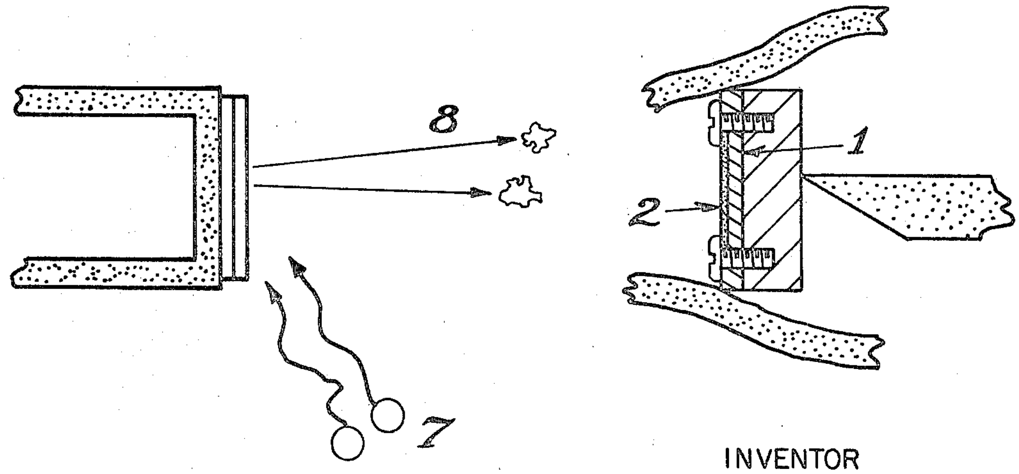

The method of producing semiconductor devices having extremely small area junctions disclosed herein is based upon the damage tracks produced in insulating solids by energetic particles such as alpha particles. This phenomenon is discussed in an article entitled "Tracks of Charged Particles and Solids," by F. L. Fleischer, P. B. Price and R. M. Walker in Science, vol. 149, No. 3682, pp. 383–393 (July 23, 1965). The general method to utilize this fact is summarized as follows:

High energy ions are produced such as in a high-voltage accelerator, or by neutron bombardment with a thermal neutron flux of $7 \times 18^9$ *nvt* of a fissionable material as shown in FIG. 5, and these ions are made to impinge on a protective dielectric layer such as glass or $SiO_2$ covering the semiconductor wafer, which dielectric layer has been previously deposited or grown on the semiconductor surface by means well known to the art, some of which are described in "Vacuum Deposition of Thin Films," by L. Holland, published by John Wiley and Sons, Inc., New York, 1956. Mainly through ionization, the high energy ion loses its energy and severely damages the dielectric layer along a straight line "ion track" until the range of the ion is reached. The thickness of the dielectric layer is designed to be less than the range of the ion so that when the slice is etched, preferential etching occurs along the track to the dielectric-semiconductor interface. Preferential etching will not continue into the semiconductor since damage is minimal, because the repulsive coulomb forces of the atoms of semiconductors and conductors ionized by the ion along its path of flight is neutralized by the electrons of the higher conductivity materials. For a given insulator, it is necessary to use a particle having an energy above a threshold value, which depends upon the mass. For glass and quartz, the lightest detectable ion is sulfur of 33 AMU, with the critical rate of energy loss being 15 mev./mg.-cm.$^2$. (Table I, page 386 Science, vol. 149, No. 3682, July 23, 1965, "Tracks of Charged Particles and Solids," by F. L. Fleischer, P. B. Price, and R. M. Walker). The damage tracks of sub-microscopic cross section are produced along the track followed by the particle in straight lines in the dielectric material and these tracks are randomly spaced over the dielectric surface area. The latent damage tracks which etch out faster than the undamaged dielectric are "developed" by preferential etching of the dielectric by an acid such as hydrofluoric acid. Thus, microminiature hollow tubes, tapered or cylindrical, result. The technique has virtually no bound on the degree of miniaturization of apertures in the dielectric and fine hollow tubes as small as 50 A. have been obtained in mica. (See p. 383 of previous article mentioned above "Tracks of Charged Particles and Solids.")

Figure 4:
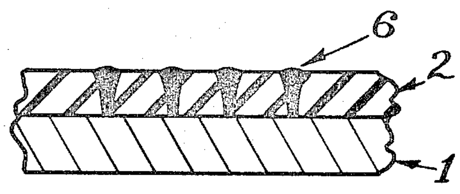

The most direct process for completing the fabrication of a semiconductor device is to deposit a metal 6 in the etched apertures 5 (see FIG. 4) to make Schottky-barrier diodes. It might seem difficult to deposit metal in a hole that is too small to be defined by the wavelength of light; however, deposition by electroplating from an aqueous solution proves to have remarkable capability of penetrating fine pores. This deposition can be used directly to make Schottky-barrier diodes and also to deposit metal to be alloyed to make P-N junction diodes.

Another technique for completing the device is to slip a "cat whisker" (3–5 mil tungsten wire having a tapered point on one end) through one of the apertures and make a point contact diode. Such a diode would have excellent stability with a very fine point, because it would be supported by a sleeve prefabricated through the non-conductive layer.

It is therefore an object of the present invention to provide an improved process for making small-area rectifying junctons in a semiconductor body.

A feature of this invention is a particular sequence of steps for forming extremely small apertures in an insulating or dielectric coating placed on the surface of a semiconductor which takes advantage of damage tracks produced in insulating solids when exposed to energetic particles of fissionable materials.

DESCRIPTION OF THE INVENTION

The instant invention is herein described with reference to the accompanying drawings, in which:

FIGS. 1–4 illustrate various steps in practicing this invention;

FIG. 5 schematically illustrates the irradiation of a semiconductor sample with energetic particles derived from a fissionable material.

The first step in the process of this invention is to deposit or grow on the surface of a semiconductor slice 1 (FIGS. 1–4), such as, for example, silicon, germanium or gallium arsenide, a non-conductive or insulating layer of material 2. The insulating material can be any of a variety of glasses such as silicon dioxide or phosphosilicate glass well known in the semiconductor art. One method of providing such an insulating material on silicon, for example, is described in U.S. Patent No. 2,802,760, by L. Derick et al., in "Oxidation of Semiconductive Surfaces for Controlled Diffusion"; and various deposition methods are described in a book entitled "Vacuum Deposition of Thin Films," by L. Holland, published by John Wiley and Sons, Inc., New York, 1956. Thicknesses of the insulating material commonly used in the semiconductor art, such as, for example, 5000–10,000 angstroms, is sufficient to practice this invention, as this thickness is less than the range of the damaging ion penetration. Certain portions of the insulating layer will remain as a permanent element of the end product.

Figure 2:
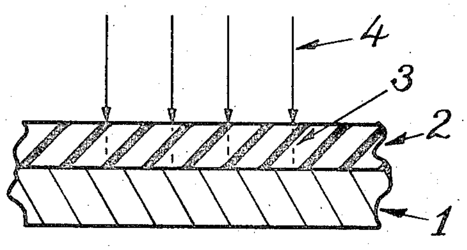
Figure 3:
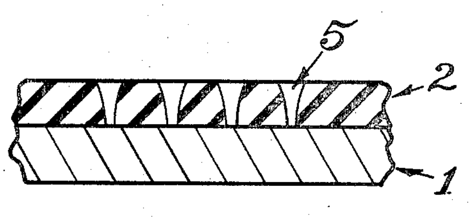

The next step is to irradiate the non-conductive layer with energetic particles of a fissionable material. Although FIG. 2 shows a uniform distribution of damage tracks 3 from energetic particles 4, uniformity of irradiation is not essential to the practice of the invention. Indeed one of the objects of the irradiation is to provide a matrix of damage tracks in the insulating layer, which when etched out to form microminiature hollow tubes 5, and then plated with metallic material 6, will form a matrix of Schottky-barrier semiconductor diodes spaced randomly across the surface. The density of the microminiature hollow tubes must be such that, when the slice is cut up into dice with several diodes remaining thereon, and these dice are inserted in a mixer or detector package, the probability of contacting at least one diode by a spring or wire mesh electrode is good. More than one diode junction may be contacted and these particular diodes will be selected at the final testing procedure for particular desired applications. However, since electrical insulation of the individual diodes must be maintained, the number density must not be too high. A practical track density to achieve the above diode density is considered to be $3\times10^6$ tracks/cm., and this track density is produced by bombardment of a fissionable material, such as uranium U–235, by neutrons 7, in FIG. 5, of a thermal neutron flux of $7\times10^9$ *nvt* which produces fission fragments 8 in sufficient quantity to give the above track density on the insulating layer 2.

A suitable apparatus for irradiating the sample is described on page 511 of an article by R. L. Fleischer, P. B. Price and R. M. Walker entitled "Method of Forming Fine Holes of Near Atomic Dimensions," which appeared in The Review of Scientific Instruments, volume 34, Number 5, May 1963.

Other means for producing energetic particles are available and known, the most direct being the use of a high-voltage accelerator, similar to Model MP–20, manufactured and sold by High Voltage Engineering of Burlington, Mass. This model will handle heavy ions with atomic weights greater than 30 which is desirable for this process.

Still another step in the process of the instant invention is to etch out the damage tracks 3 in the insulating material 2, to produce microminiature apertures or hollow tubes 5. A suitable solution which provides a high degree of preferential etching of the damaged glass is prepared by mixing four parts (by volume) of a 40% (by weight) solution of ammonium fluoride with one part of a 50% (by weight) solution of hydrofluoric acid. The size of the hole produced varies with particle size, etching time concentration and temperatures of etching solution and crystal structure of material to be etched. For glass, such as $SiO_2$, and the U–235 alpha particle causing the damage track, and with the above mentioned etching solution being maintained at 25° C., the etching time is approximately 3 to 4 minutes per micron thickness of glass. Since the thickness of glass normally used is 10,000 angstroms or 1 micron the etching time for best results is 3 to 4 minutes which will result in a tapered hole 5, which is approximately 10,000 angstroms diameter at the surface and about 3000 to 5000 angstroms diameter at the glass-silicon interface. Longer etching times will merely enlarge both these holes. For smaller holes a thinner insulating glass coating is used, for example, 2500 angstroms which would result after approximately 1 minute of etching in a hole having a diameter of 2500 angstroms at the surface and about 800 to 900 angstroms at the glass and silicon interface. Since the alpha particle of U–235 will easily penetrate and leave damage tracks in glass up to 20,000 angstroms in thickness, glasses of this thickness may be used resulting in holes having surface diameters of 20,000 angstroms and interface diameters of 8000 to 10,000 angstroms by utilizing the above method of etching. Of course for larger holes longer etching times are used provided that the surrounding undamaged glass is not completely etched away.

Once windows or apertures 5 have been opened in the insulating layer 2, so as to communicate through these holes 5 to the semiconductor surface 1, junctions can be formed in the semiconductor by a variety of means.

Conventional diffusion of semiconductor impurities of a conductivity type opposite to the base semiconductor 1, can be performed by a method similar to that disclosed in U.S. Patent No. 2,802,760, by Derick et al., entitled "Oxidation of Semiconductive Surfaces for Controlled Diffusion," or by the method of Derick and Froesch, U.S. Patent No. 2,802,760. This technique produces a diffused semiconductor junction.

Another technique is the alloying technique wherein a metal containing semiconductor impurities of a conductivity type opposite that of the base semiconductor 1, such as, for example, indium is alloyed into the base semiconductor 1, through the openings 5.

A preferred method for this invention is to form Schottky-barrier junctions on the semiconductor 1 such as silicon, germanium or gallium arsenide through the openings 5. To form a Schottky-barrier diode on silicon, for example, it is merely necessary to plate or otherwise deposit on a doped silicon surface a metal such as nickel, copper, iron, having a low surface barrier potential. Other metals that can be used are silver, gold, tin, aluminum and tungsten. A rectifying barrier is formed at the metal semiconductor surface. A suitable solution for plating nickel on silicon is as follows: 910 gms. NiCl C.P.; 474 gms. HCl concentrated (12 molar); 3780 ml. $H_2O$; 100 ml. HF (48%) (27 molar).

Plating is carried out at a bath temperature of 60 to 70° C. using standard plating equipment such as a D.C. power supply, D.C. current meter, and plating tank purchaseable at any company selling plating equipment and supplies such as M. E. Baker Co., Cambridge, Mass. In plating nickel on silicon a high current density of 1–5000 amperes per cm.$^2$ for 1 to 2 seconds is first applied; then the current is reduced to 5 amperes/cm.$^2$. A current of 5 amperes/cm.$^2$ will plate approximately 3000 angstroms of nickel per minute on silicon, hence the plating time depends on the thickness of the glass insulating layer and the height of the button above the surface of the insulating layer. At least 1 micron or 10,000 angstroms above the insulating layer is desirable. If the glass insulating layer is 10,000 angstroms, the total height of the nickel metal contact would be 20,000 angstroms and a total time of approximately 6 to 7 minutes is required.

The ratio of the diameter of the nickel-metal-contact to the height of the nickel-metal-contact above the insulating glass is 2 to 1; hence for the condition described above, a metal contact diameter of 40,000 angstroms will result, at the uppermost point, and at the nickel-silicon interface the diameter would be constricted by the diameter of the aperture of the glass at that point. The shape of the uppermost surface of the nickel-metal-contact is dependent on the current density, being convex for a low current density (5 amperes per cm.$^2$) and concave for a high-current density (1000 amperes per cm.$^2$).

After this stage we have a slice of semiconductor having thereon a random matrix of Schottky-barrier diodes, which may be cut to dice size 20 x 20 mils or 10 x 10 mils and packaged in an appropriate semiconductor diode package utilizing conventional known packaging techniques.

There now will be described a specific example of the practice of this invention:

EXAMPLE

On an epitaxial silicon slice approximately 0.5 inch in diameter and 5 mils thick and having a substrate resistivity of .001 to .002 ohm-cm. with an epitaxial layer of 0.5 micron thick and 0.15 ohm-cm resistivity is grown a silicon dioxide glass 10,000 angstroms thick by the method of L. Derick et al., U.S. Patent No. 2,802,760. The slice is placed with its glassed surface facing upward in an apparatus similiar to that described by R. L. Fleischer et al., in a "Method of Forming Fine Holes of Near Atomic Dimensions," The Review of Scientific Instruments, vol. 34, Number 5, May 1963, p. 511, and irradiated with U-235 alpha particles. (The above techniques and apparatus are known in their respective arts.)

To produce the desired number of damage tracks of $3\times10^6$ tracks/cm.$^2$, a neutron flux of $7\times10^9$ *nvt* is used. The irradiated silicon slice is next etched in a solution prepared by mixing four parts (by volume) of a 40% (by weight) solution of ammonium fluoride with one part of a 50% (by weight) solution of hydrofluoric acid, at room temperature for approximately 3 minutes. The damage tracks will be replaced by microminiature hollow tubes having a diameter of about 10,000 angstroms at the surface of the glass and 3000 to 5000 angstroms at the silicon-glass interface. The holes are plated with nickel at a temperature between 60° to 70° C. using a plating solution comprising the following: 910 gms. NiCl C.P.; 474 gms. HCl concentrated (12 molar); 3780 ml. $H_2O$; 100 ml. HF (48%) (27 molar).

The plating current is applied in two distinct steps. First a D.C. current of 1000 amperes/cm.$^2$ is applied for 2 seconds and then the current is reduced to approximately 5 amperes/cm.$^2$ for a total time of 6 to 7 minutes. This will result in a matrix of Schottky-barrier diodes on the silicon slice. The slice is cut up in a gang saw to a size of 22 mils by 22 mils and packaged in a desired semiconductor package using conventional processing techniques, and then tested for the desired electrical parameters.

No attempt has been made to illustrate all possible methods of the invention, but rather to illustrate its principle. Therefore, such other forms as would occur to one skilled in this art on a reading of the foregoing specification are also within the spirit and scope of this invention.

What is claimed is:

1. The process of producing small area semiconductor devices which comprises depositing a non-conductive layer upon a semiconductor surface, irradiating said non-conductive layer with particles at an energy level sufficient to promote latent damage tracks, etching said damage tracks so as to replace the linear trails of damaged material with fine hollow tubes, forming a semiconductive junction through said hollow tube on the semiconductor substrate, and depositing a metallic ohmic contact to fill the remainder of the hollow tube.

2. The process of producing small area semiconductor devices as recited in claim 1, wherein the semiconducting junction is a PN junction produced by diffusing impurities into the semiconductor limited by the etched hollow tube, the undamaged portion of the non-conducting layer acting as a mask inhibiting impurity diffusion.

3. The process of producing small area semiconductor device as recited in claim 1, wherein the semiconducting junction is a PN junction produced by alloying impurities into the semiconductor limited by the etched hollow tube, the undamaged portion of the non-conducting layer acting as a mask inhibiting the alloying of impurities.

4. The process of producing small area semiconductor devices as recited in claim 1, wherein the semiconductive junction is a metal silicon junction formed by a metal deposited by electroplating from an aqueous solution onto the semiconductor surface and limited in area to the etched hollow tube, the undamaged portion of the non-conducting layer acting as a mask inhibiting the deposition of metal.

5. The process of producing small area semiconductor devices as recited in claim 4, wherein the deposited metal is selected from the group comprising nickel, gold, tin, copper, silver, aluminum, and tungsten.

6. The process of producing small area semiconductor devices as recited in claim 4, wherein the semiconductor material is selected from the group comprising silicon, germanium and gallium arsenide.

7. The process of producing small area semiconductor devices as recited in claim 1, wherein irradiation of the non-conductive layer is carried out by fission fragments produced by neutron bombardment of a fissionable material.

8. The process of producing small area semiconductor device as recited in claim 7, wherein the thermal neutron flux to produce the fission fragments is $7 \times 10^9$ *nvt.*

9. The process of producing small area semiconductor devices as recited in claim 1, wherein irradiation of the non-conductive layer is performed by energetic particles energized in a high-voltage accelerator.

10. The process of producing small area semiconductor devices as recited in claim 9, wherein the particles are selected from the group comprising atomic weights greater than 30.

11. The process of producing small area semiconductor devices as recited in claim 1, wherein the semiconductor is silicon and the non-conductive layer is glass grown on the silicon body.

12. The process of producing small area semiconductor devices which comprises depositing a non-conductive layer upon a semiconductor surface, irradiating said non-conductive layer with particles at an energy level sufficient to promote latent damage tracks in said deposited non-conductive layer, etching said damage tracks so as to replace the linear trails of damaged material with fine hollow tubes, and making semiconductive contact with said semiconductor through said hollow tubes.

13. The process of producing small area semiconductor devices as recited in claim 12 wherein a cat whisker wire makes semiconductive contact with the semiconductor through said hollow tubes to form a point contact diode.

References Cited

UNITED STATES PATENTS 3,507,709 4/1970 Bower -------------- 148—1.5

L. DEWAYNE RUTLEDGE, Primary Examiner

R. A. LESTER, Assistant Examiner

U.S. Cl. X.R.

117—93.3, 201, 212; 148—179